(12) United States Patent  
Caldwell et al.

(10) Patent No.: US 6,396,699 B1  
(45) Date of Patent: May 28, 2002

(54) HEAT SINK WITH CHIP DIE EMC GROUND INTERCONNECT

(75) Inventors: Barry Caldwell, Hesston; Craig C. McCombs, Wichita, both of KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/766,104

(22) Filed: Jan. 19, 2001

(51) Int. Cl.[7] .............................. H05K 7/20
(52) U.S. Cl. .................. 361/704; 361/707; 361/712; 361/760; 361/772; 361/773; 361/774; 257/706; 257/707; 257/737; 257/738
(58) Field of Search ................ 361/704, 707, 361/713, 717–719, 760, 764; 757/706, 707, 712, 713, 717; 174/16.3, 252; 165/80.2, 80.3, 185

(56) References Cited

U.S. PATENT DOCUMENTS

| | | | | |
|---|---|---|---|---|
| 5,642,261 A | * | 6/1997 | Bond et al. ................ | 361/704 |
| 5,691,041 A | * | 11/1997 | Frankeny et al. ........... | 428/209 |
| 5,790,377 A | * | 8/1998 | Schreiber et al. ........... | 361/704 |
| 5,808,874 A | * | 9/1998 | Smith ........................ | 361/769 |
| 6,127,724 A | * | 10/2000 | DiStefano .................. | 257/675 |
| 6,144,101 A | * | 11/2000 | Akram ....................... | 257/778 |
| 6,166,435 A | * | 12/2000 | Leu et al. ................... | 257/704 |
| 6,265,771 B1 | * | 7/2001 | Ference et al. ............. | 257/706 |

* cited by examiner

Primary Examiner—Lynn D. Feild  
Assistant Examiner—Boris L. Chervinsky  
(74) Attorney, Agent, or Firm—Suiter & Associates PC

(57) ABSTRACT

An apparatus for mounting a heat sink to a chip package such as a BGA type chip package or the like is disclosed. In an exemplary embodiment, ground bumps are formed on the die substrate of the chip package and on the heat mating surface of the heat sink to be attached to the package. The ground bumps formed on the die protrude into the body of dimples formed in the body of the chip encapsulation package to make thermal/electrical ground contact with the ground bumps formed on the heat mating surface of the heat sink for electrically grounding the heat sink.

20 Claims, 3 Drawing Sheets

HEAT SINK WITH CHIP DIE EMC GROUND INTERCONNECT

FIELD OF THE INVENTION

The present invention generally relates to the field of semiconductor packaging, and more particularly to apparatus for attaching chip mounted heat sinks to chip packages such as ball grid array (BGA) type chip packages or the like, wherein the apparatus provides an electromagnetic channel (EMC) ground interconnect with the chip's integrated circuit die so that the heat sink does not become an efficient electromagnetic interference (EMI) radiator.

BACKGROUND OF THE INVENTION

Current semiconductor packaging technology involves mounting integrated circuit chips on chip carriers such as ceramic substrates or assembling the chips into plastic packages which provide the necessary pin or lead input/output connections. Wire bonding and flip chip bonding provide two principal methods of connecting chips to such substrates or packages. Wire bonding utilizes short wires (wire bonds), typically formed of aluminum or gold, which are connected by ultrasonic bonding from wire bond pads (input/output (I/O) pads) on the chip to metal pads on a chip carrier or, for plastic packages, to leads of a lead frame. Flip chip bonding utilizes solder balls placed on the chip die. The chip die is then "flipped" over onto the chip carrier and the solder melted.

Ball Grid Array (BGA) packages connect to the Printed Circuit Board (PCB) through an array of solder balls beneath the packages. This area array of solder balls reduces package size and increases lead pitch, leading to higher assembly yields. Because of the increasing density of the integrated circuit dies utilizing BGA packaging, it is often desirable to mount a heat sink directly to the BGA package, in order to dissipate heat generated by the die. However, by attaching such heat sinks to the die within the package, an electromagnetic interference (EMI) radiator or antenna may be created, which may adversely affect function of the integrated circuit die or other components mounted to the printed circuit board. Presently, EMI radiation through the heat sink is reduced by soldering wires from the heat sink to ground points on the printed circuit board in order to ground the heat sink to the circuit board. Thus, there currently exists no way to efficiently automate the placement of the heat sink, which requires a metal conductor from the heat sink to the printed circuit board.

Consequently, it is desirable to provide an apparatus for attaching chip mounted heat sinks to chip packages, wherein the apparatus provides an EMC ground interconnect with the chip's integrated circuit die so that the heat sink does not become an efficient EMI radiator. It is further desirable, that this apparatus facilitate efficient automation of attachment of the heat sink to the chip package, and eliminate the requirement of a metal conductor from the heat sink to the printed circuit board.

SUMMARY OF THE INVENTION

Accordingly, the present invention is directed to apparatus for attaching chip mounted heat sinks to chip packages such as ball grid array (BGA) type chip packages, or the like, wherein the apparatus provides an EMC ground interconnect with the chip's integrated circuit die so that the heat sink does not become an efficient EMI radiator. In an exemplary embodiment, ground bumps are formed on the die substrate of the chip package and on the heat mating surface of the heat sink to be attached to the package. The ground bumps formed on the die protrude into the body of dimples formed in the encapsulation cap of the chip package to make thermal/electrical ground contact with the ground bumps formed on the heat mating surface of the heat sink for electrically grounding the heat sink to the die. In this manner, an EMC ground interconnect between the heat sink and the integrated circuit die is created.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 1:
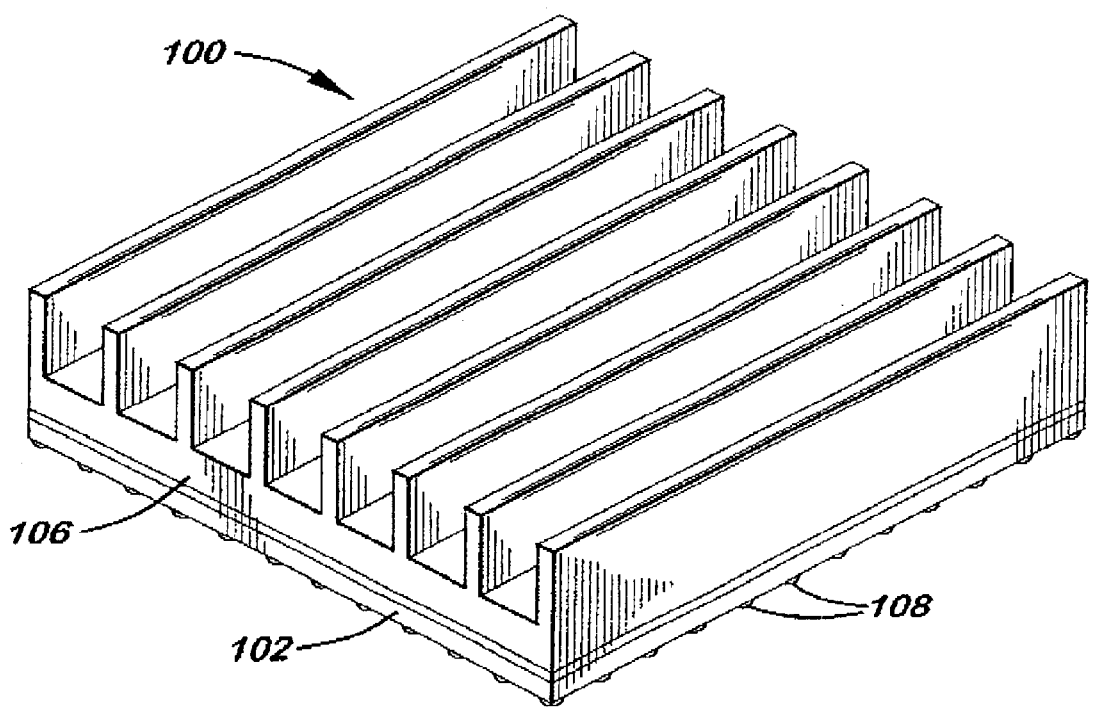
FIG. 1 is an isometric view of a chip package and heat sink assembly in accordance with an exemplary embodiment of the present invention.

Referring now to FIG. 1, a chip package and heat sink assembly in accordance with an exemplary embodiment of the present invention is described. The chip package and heat sink assembly 100 includes a chip package 102 suitable for housing one or more integrated circuit (IC) dies 104 (FIG. 4) to which a heat sink 106 is thermally coupled for dissipating heat generated by the die 104. In an exemplary embodiments, the chip package 102 may be a Ball Grid Array (BGA) type chip package employing an array of solder balls 108 beneath the package 102 for connecting the package 102, and the integrated circuit die 104 contained therein, to a printed circuit board (PCB), or the like (not shown).

Figure 2:
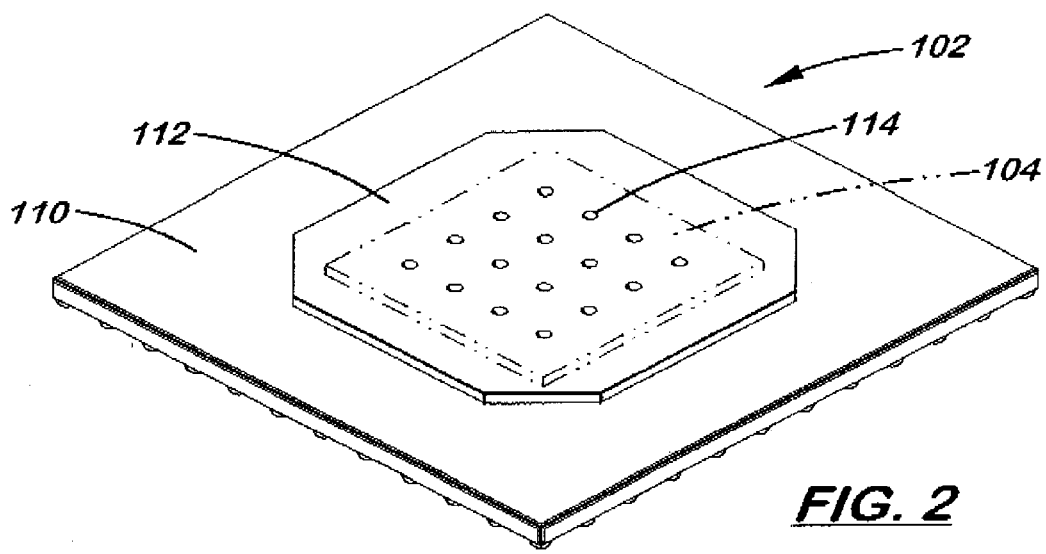
FIG. 2 is an isometric view of the heat sink shown in FIG. 1, further illustrating ground bumps formed on the heat mating surface of the heat sink.

Referring now to FIG. 2, an exemplary chip package is described. The chip package 102 includes a carrier substrate 110 on which the integrated circuit chip or die 104 (FIG. 4) is bonded to provide electrical circuit contact for functional operation. Once bonded to carrier substrate 110, the integrated circuit die 104 is encapsulated by an encapsulation cap 112. In exemplary embodiments, suitable encapsulation caps 112 may be formed of plastic, or may be ceramic depending on the package design. As shown in FIG. 2, an array of holes or dimples 114 are formed in the encapsulation cap 112 so that they are disposed over the integrated circuit die 104. In exemplary embodiments of the invention, dimples 114 are generally half-spherical or parabolic in shape (see FIG. 5).

Figure 3:
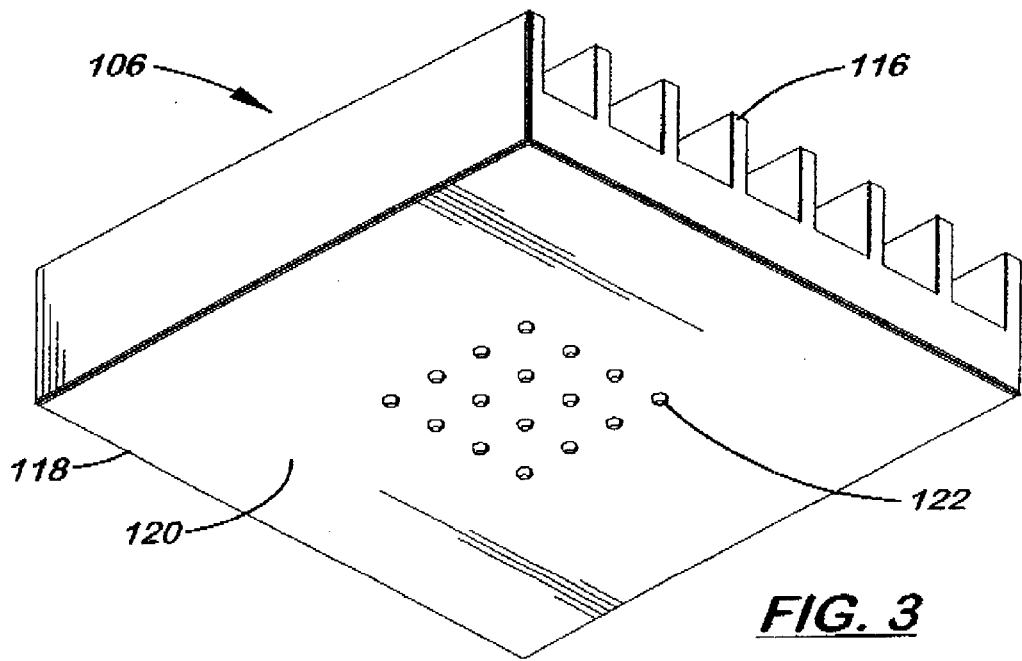
FIG. 3 is an isometric view of the chip package shown in FIG. 1, further illustrating dimples formed in the package.

Turning now to FIG. 3, an exemplary heat sink is described. As shown in FIG. 3, the heat sink 106 preferably includes a heat dissipation mechanism or assembly such as fins 116, or the like which extend from its outer surface 118. These fins 116 allow heat to be dissipated to the surrounding atmosphere through conduction and/or radiation. Heat sink 106 further includes a heat mating surface 120 opposite outer surface 118 for attachment to chip package 102. Preferably, the heat mating surface 120 is thermally coupled to the chip package 102 for allowing transfer of heat from the package 102 to the heat sink 106. In accordance with an exemplary embodiment of the present invention, arrays of electrically and thermally conductive ground bumps 122 are formed on the heat mating surface 120 of heat sink 106. When the chip package and heat sink assembly 100 are assembled, these ground bumps 122 extend into dimples 114 formed in the encapsulation cap 112 of chip package 102 (see FIG. 2) where they are electrically and thermally bonded or soldered to corresponding ground bumps 124 formed on the integrated circuit chip or die 104 (FIG. 4). In this manner, the heat sink 106 is electrically grounded to the integrated circuit die 104 for providing an EMC ground interconnect between the heat sink 106 and the die 104.

Figure 4A:
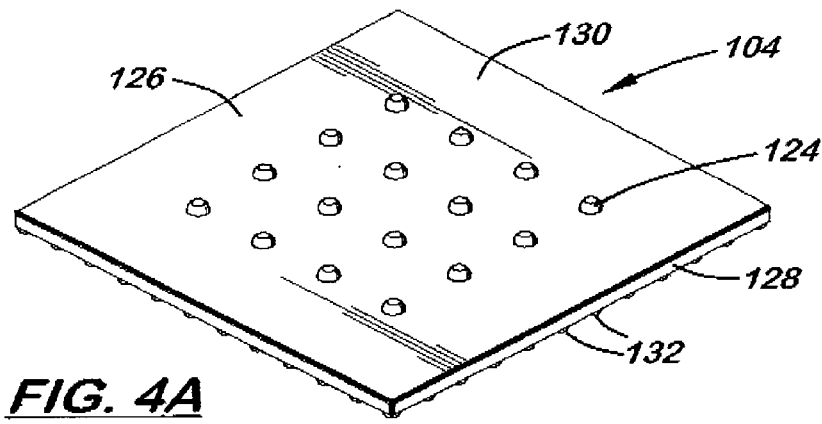
FIGS. 4A and 4B are isometric views of exemplary integrated circuit dies of the chip package shown in FIG. 1, further illustrating ground bumps formed in the surface of the substrate.
Figure 4B:
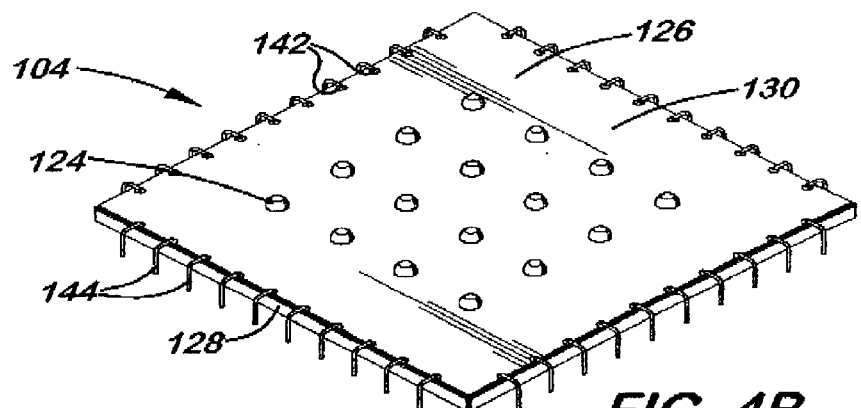

Referring now to FIGS. 4A and 4B, integrated circuit chips or dies suitable for encapsulation in the chip package shown in FIG. 2 are described. As shown, the integrated circuit chip or die 104 is comprised of a substrate 126 having a first or circuit face 128 on which integrated circuitry may be formed, and a second or substrate face 130 typically containing a minimum of such integrated circuitry. In exemplary embodiments, the die 104 may utilize either flip chip technology (shown in FIG. 4A), or may be a wire bonded out die (shown in FIG. 4B). Wherein the integrated circuit die 104 utilizes flip chip technology, as shown in FIG. 4A, one or more interconnect circuit bumps 132 may be formed on the circuit face 128 of the die 104 for providing electrical connection of the die 104 to the carrier substrate 110 of the chip package 102 for functional operation (see FIG. 2). In chip packages 102 employing wire bonding technologies, as shown in FIG. 4B, the die 104 may employ wire bond pads 142 instead of the interconnect circuit bumps 132. These wire bond pads 142 are connected to a chip carrier or lead frame via wire bonds 144.

In accordance with an exemplary embodiment of the present invention, an array of electrically and thermally conductive ground bumps 124 are formed on the substrate face 130 of integrated circuit die 104. When the chip package and heat sink assembly 100 is assembled, these ground bumps 124 protrude into the bodies of dimples 114 formed in the encapsulation cap 112 of the chip package 102 (see FIG. 2) to make thermal/electrical ground contact with the ground bumps 122 formed on the heat mating surface 120 of heat sink 106 (see FIG. 3) for electrically grounding the heat sink 106 to the die 104. In this manner, an EMC ground interconnect between the heat sink and the integrated circuit die is created.

Figure 5:
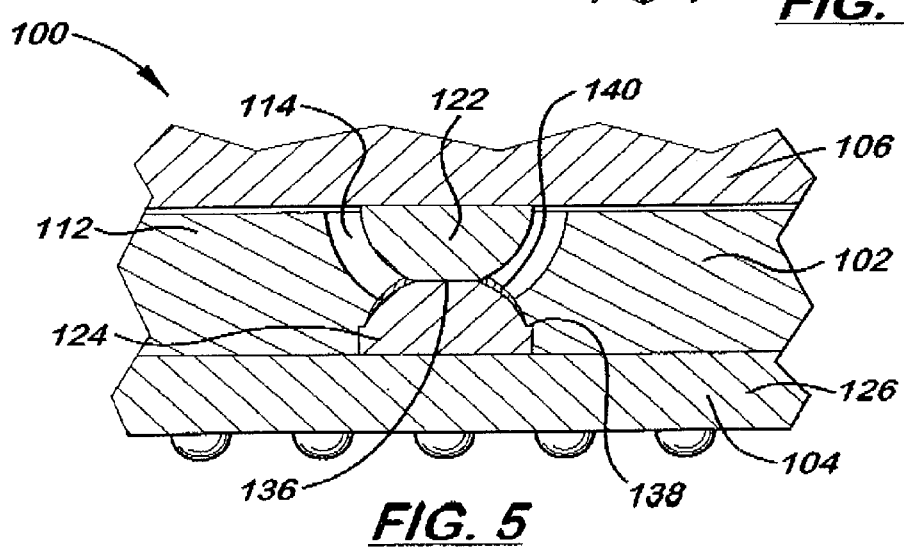
FIG. 5 is a partial cross-sectional view of the chip package heat sink assembly shown in FIG. 1, further illustrating the EMC ground interconnect for thermally and electrically coupling the heat mating surface of the heat sink to the integrated circuit die substrate.

Referring now to FIG. 5, cooperation of ground bumps formed on the heat sink and integrated circuit die substrate to provide an EMC ground interconnect for thermally and electrically coupling the heat sink to the integrated circuit die is described. Ground bumps 124 formed on the die substrate 126 protrude into the bodies of dimples 114 formed in encapsulation cap 112 to make thermal and electrical ground contact with the ground bumps 122 of heat sink 106. The ground bumps 122 & 124 are thermally and electrically bonded together for electrically grounding the heat sink 106 to the die 104. Preferably, ground bumps 142 are electrically connected to the ground plane of the integrated circuit die 104 so that an EMC ground interconnect is created between the heat sink 106 and the die 104 preventing the heat sink 106 from functioning as an efficient EMI radiator or antenna.

Preferably, ground bumps 122 & 124 include a main body having a generally half-spherical shape. However, it will be understood that the ground bumps may have other shapes such as half-elliptical, parabolic, rectangular, square, or the like. Consequently, substitution of ground bumps having other shapes for the half-spherical bumps specifically shown and described herein would not depart from the scope and spirit of the invention as claimed in the appended claims. Further, in exemplary embodiments, ground bumps 124 may include a flattened top portion 136 for providing a larger contact surface area for electrical and thermal contact with ground bumps 122 of heat sink 106. Each ground bump 124 may further include a substrate shield 138 for shielding the integrated circuit die 104 from solder or, alternatively, electrical or thermal bondant. In exemplary embodiments of the invention, this substrate shield 138 may be comprised of a indentation or extrusion extending about ground bump 124 that is bonded around by encapsulation material of the encapsulation cap 112 so that solder or bondant will not make contact with the die substrate 122 except in the intended bonding area of the ground bumps 124. Preferably, the encapsulation material of the cap 112 also forms a hermetic seal 140 around ground bumps 124 so that the integrated circuit die 104 is protected from environmental contaminants.

It will be appreciated that the apparatus of the present invention facilitates efficient automation of the attachment of the heat sink 106 to the chip package 102, since the apparatus eliminates the requirement for metal conductors from the heat sink to the printed circuit board (PCB) on which the chip package 102 is mounted, while still providing an efficient thermal and electrical ground for the heat sink 106.

It is believed that the of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. Apparatus for coupling a heat sink to a chip package, comprising:
   at least one first ground bump formed on a integrated circuit die of said chip package; and
   at least one second ground bump formed on said heat sink;
   wherein said first ground bump protrudes into a dimple formed in said chip package for making ground contact with said second ground bump for grounding said heat sink to said integrated circuit die.

2. The apparatus as claimed in claim 1, wherein said first and second ground bumps provide a thermal and electrical ground between said heat sink and said integrated circuit die.

3. The apparatus as claimed in claim 1, wherein said chip package provides a hermetic seal around said first ground bump.

4. The apparatus as claimed in claim 1, wherein at least one of said first ground bump and said second ground bump are half-spherical in shape.

5. The apparatus as claimed in claim 1, wherein said first ground bump comprises a flattened top portion for providing a contact surface area for electrical and thermal contact.

6. The apparatus as claimed in claim 1, wherein said first ground bump comprises a substrate shield for shielding the integrated circuit die from solder or bondant.

7. The apparatus as claimed in claim 1, wherein the chip package comprises a ball grid array (BGA) type chip package.

8. The apparatus as claimed in claim 1, wherein said heat sink comprises a heat dissipation assembly.

9. The apparatus as claimed in claim 1, wherein said integrated circuit die comprises one of a flip chip die and a wire bonded out die.

10. The apparatus as claimed in claim 1, wherein said chip package comprises one of a plastic package and a ceramic package.

11. A chip package and heat sink assembly, comprising an integrated circuit die including a surface having a plurality of first ground bump formed thereon;

a chip package suitable for holding said integrated circuit die, said chip package having a plurality of dimples formed therein; and a heat sink having a mating surface suitable for attachment to said chip package, said mating surface having at least one second ground bumps formed thereon;

wherein said plurality of first ground bumps protrude into said dimples for making ground contact with said plurality of second ground bumps for grounding said heat sink to said integrated circuit die.

12. The chip package and heat sink assembly as claimed in claim 11, wherein said ground contact provides a thermal and electrical ground between said heat sink and said integrated circuit die.

13. The chip package and heat sink assembly as claimed in claim 11, wherein said chip package provides a hermetic seal around said first ground bump.

14. The chip package and heat sink assembly as claimed in claim 11, wherein at least one of said first ground bump and said second ground bump are half-spherical in shape.

15. The chip package and heat sink assembly as claimed in claim 11, wherein said first ground bump comprises a flattened top portion for providing a contact surface area for electrical and thermal contact.

16. The chip package and heat sink assembly as claimed in claim 11, wherein said first ground bump comprises a substrate shield for shielding said integrated circuit die from solder or bondant.

17. The chip package and heat sink assembly as claimed in claim 11, wherein the chip package comprises a ball grid array (BGA) type chip package.

18. The chip package and heat sink assembly as claimed in claim 11, wherein said heat sink comprises a heat dissipation assembly.

19. The chip package and heat sink assembly as claimed in claim 11, wherein said integrated circuit die comprises one of a flip chip die and a wire bonded out die.

20. The chip package and heat sink assembly as claimed in claim 11, wherein said chip package comprises one of a plastic package and a ceramic package.

* * * * *